United States Patent [19]

Kirn

[11] Patent Number: 4,773,096

[45] Date of Patent: Sep. 20, 1988

[54] DIGITAL SWITCHING POWER AMPLIFIER

[76] Inventor: Larry J. Kirn, 1061 Northlawn, Birmingham, Mich. 48009

[21] Appl. No.: 75,768

[22] Filed: Jul. 20, 1987

[51] Int. Cl.$^4$ .............................................. H03F 3/38
[52] U.S. Cl. ...................................... 381/120; 330/10
[58] Field of Search ........................... 330/10; 381/120

[56] References Cited

U.S. PATENT DOCUMENTS

| | | | |
|---|---|---|---|
| 4,240,036 | 12/1980 | Kohler | 330/10 |
| 4,371,840 | 2/1983 | Yokohama | 330/10 |
| 4,404,526 | 9/1983 | Kirn | 330/10 |
| 4,415,862 | 11/1983 | Kunugi | 330/10 |
| 4,703,283 | 10/1987 | Samuels | 330/10 |
| 4,725,788 | 2/1988 | Lodahl | 330/10 |

FOREIGN PATENT DOCUMENTS

3538661 1/1987 Fed. Rep. of Germany ........ 330/10

*Primary Examiner*—Howard A. Birmiel
*Attorney, Agent, or Firm*—Krass & Young

[57] ABSTRACT

The present invention is a digital switching power amplifier particularly adapted for generation of a high power output from a digital input signal. The digital input signal, comprising a series of M bit digital words at a predetermined sampling rate, is compared with a digital ramp signal which counts through the range from zero to $2^M$. A similar second comparison is made between an inverted digital input signal and the digital ramp signal. These comparisons control separate application of one of two polarities of a DC power source to corresponding terminals of the load device. The net voltage coupled to the load is a two polarity pulse width modulated signal corresponding to the digital input signal. In an alternative embodiment the second comparison is between the digital input signal and a digital ramp signal of the opposite slope. In a further embodiment a digital signal source, such as a compact disk player or digital tape recorder, is included with a digital encoder, a similar encoder for an analog input signal and a switch device to select the analog or the digital encoder for driving the load.

15 Claims, 6 Drawing Sheets

DIGITAL SWITCHING POWER AMPLIFIER

FIELD OF THE INVENTION

The field of the present invention is that of digital switching power amplifiers and in particular those employed for driving a loudspeaker from a digital signal source.

BACKGROUND OF THE INVENTION

The present invention is in the field of digital power amplifiers and it is particularly useful for driving a loudspeaker from a digital signal source.

A recent development in audio systems is the development of compact disk players and digital tape recorders. Compact disk players and digital tape recorders store the audio signals of music in a digital fashion. Typically, an analog signal including the music to be recorded is sampled at a rate of 44.1 kilohertz. Each of these samples is converted into a 16 bit digital number, this 16 bit digital number representing the amplitude of the sampled analog signal. This stream of 16 bit digital words is then stored either in an optical manner on a compact disk or in a magnetic manner on a digital tape.

The reproduction of the original analog signal source occurs using a reverse process. Either a compact disk player or a digital tape player recalls the stored sequence of 16 bit digital words representing the analog signal. Each 16 bit digital word is then converted into an analog amplitude in a digital to analog converter. The resulting stepwise analog signal is then extensively filtered in order to recover an analog signal approximately the original music source. This analog signal is then supplied to a conventional analog amplifier circuit which drives a conventional loudspeaker.

Such a system is advantageous because of the advantages of the digital storage format. In particular, the digital format enables the storage of a much greater dynamic range with lower distortion than ordinarily employed in analog storage sources, such as ordinary record disks or analog tape recorders. In addition, wear in the recording media is much less objectionable to the reproduced signal when employing a digital storage technique. This is because the digital formal facilitates error correction. By contrast, an analog storage media is subject to much greater distortion from wear. Lastly, such a digital storage system does not introduce inherent noise in the same degree as an analog system. Because a passage within the analog signal having no amplitude is represented by a particular digital word, the representation of a portion of zero signal amplitude involves no different errors than that of storing any other amplitude.

While the new technique of digital storage of audio information such as music is a great improvement over prior analog storage techniques, this system inherently loses some of the advantage of the digital storage technique. In particular, the digital signal must be converted to an analog signal and extensively filtered in order to recover the original analog signal. Then this digital signal is supplied to an ordinary analog audio amplifier which drives a conventional loudspeaker. While the prior art analog audio amplifiers do not introduce as much noise and distortion as the prior art analog signal storage sources, analog audio amplifiers do introduce some measure of distortion and noise. Thus, a portion of the inherent benefit of the digital storage technique is lost in the manner of reproduction ordinarily employed.

Therefore, it would be advantageous to provide an amplifier circuit for use with such digital signal sources in order to utilize the inherent low noise capability of such digital systems.

SUMMARY OF THE INVENTION

It is the primary object of the present invention to provide a digital audio amplifier for a digital source which provides a pulse width modulated signal suitable for direct application to a load, such as a ordinary analog inductive speaker. Such a system extends the inherent benefits of an digital music system further along the signal path.

The above object is achieved through the comparison of each digital word of a string of digital words representing the signal amplitude with a digital ramp signal. In a first embodiment of the present invention, each input digital signal word is inverted. Then the digital signal word and the inverted digital signal word are separately compared to a digital ramp signal. This digital ramp signal counts through consecutive digital words throughout the entire range represented by the number of bits of the digital word once each sample. The two digital comparators compare the magnitude of the digital words from the respective sources, either the input digital word or the inverted digital word, to the digital word from the ramp function. Each comparator generates an output in a first digital state when the input digital word is less than the ramp digital word and in a second digital state when the input digital word is greater than the ramp digital word. These two comparison output signals are employed to switch respective totem-pole driver circuits employing switching transistors. These two driver circuits are coupled via respective low pass filters to opposite terminals of the load, such as an inductive speaker. This provides effective drive to the load in a pulse width modulated bridge system. The width of the pulse width modulated signal is dependent upon the difference of the original input digital word from the central or zero value. The polarity of the pulse width modulated output is based upon the input digital word being above or below the null digital word. Because a speaker commonly employed in an audio system provides an inherent smoothing function for these signals, minimal filtering is required to facilitate faithful reproduction.

In a second embodiment of the present invention, the two comparators compare the input digital word with respective ramp signals having opposite slopes. This provides essentially the same digital drive function for the totem-pole output drivers.

In accordance with a third embodiment of the present invention, a digital source, such as a compact disk player or a digital tape player is included together with an analog to digital encoding circuit for encoding analog input signals into a digital switching signal of the same type as generated in the other embodiments of this invention. A switch selects one of these two encoders to drive the switching output amplifier.

BRIEF DESCRIPTION OF THE DRAWINGS

These and other aspects of the present invention will be more fully described below in conjunction with the drawing in which.

DETAILED DESCRIPTION OF THE PREFERRED EMBODIMENT

Figure 1:
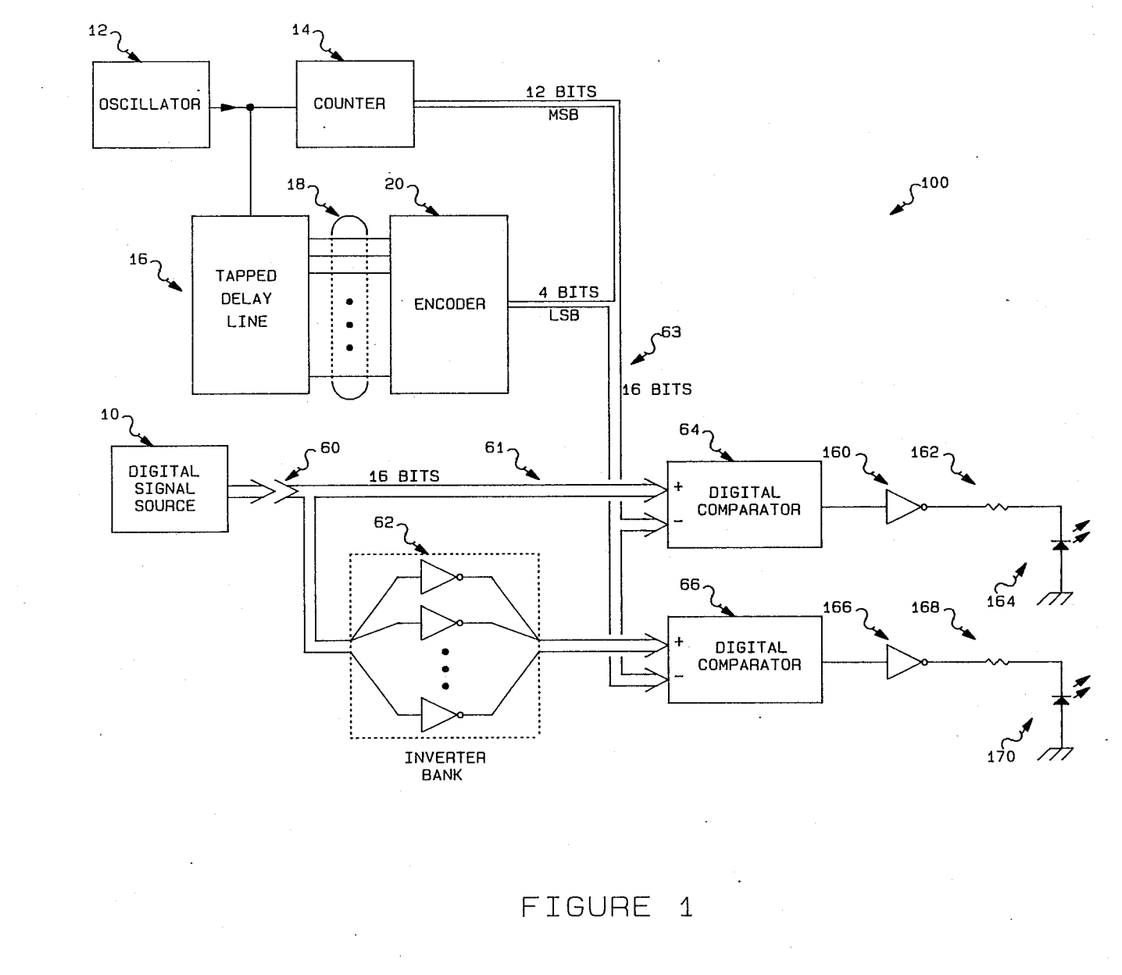
FIG. 1 is a block diagram of the digital signal encoder in accordance with a first embodiment of the present invention.

FIG. 1 illustrates a block diagram of a digital encoder circuit in accordance with a first embodiment of the present invention. The digital encoder circuit 100 receives digital signals from a digital signal source 10, produces a digital ramp signal and compares ordinary and inverted digital signals from digital signal source 10 in respective digital comparators 64 and 66. These digital comparators generate output on respective light emitting diodes 164 and 170 which are coupled to the power amplifier circuit 200 illustrated in FIG. 2.

Digital signal source 10 provides the digital signal to digital encoder 100 by bus connector 60. In accordance with the preferred embodiment of the present invention, digital signal source 10 is either a compact disk player or a digital tape recorder. In the case of the compact disk player, the digital signal is a series of 16 bit words, each 16 bit word corresponding to the magnitude of a sample of an analog waveform sampled at a rate of 44.1 kilohertz. Although other types of digital signal sources could be employed, it is believed that the parameters for digital encoding of an analog signal, such as a musical composition, would not employ a significantly differing word length or data rate. Because of the technical requirement for reproduction of sampled analog signals such as musical signals, it is not believed that any digital signal source employed as digital signal source 10 would require a word length or sampling rate greatly differing from that noted above. Firstly, the sampling rate is required to be at least twice the frequency of the highest frequency in the original digital signal source because digital music sources are typically regarded as having an upper frequency in the range of 20 kilohertz, a sampling rate of at least 40 kilohertz is required. In addition, a word length of 16 bits is required to obtain a dynamic range which is better than the dynamic range typically found in analog storage systems.

The 16 bit words from digital signal source 10 are applied to 16 bit bus 61. Sixteen bit bus 61 is coupled to the positive input of digital comparator 64. The 16 bit bus 61 is also coupled to inverter bank 62. Inverter bank 62 comprises a set of 16 digital inverters, one connected to each of the 16 lines of 16 bit bus 61. This inverter bank 62 inverts the digital state of each of the 16 bits of the 16 bit input word. The output of inverter bank 62, which is also 16 bits, is coupled to the positive input of digital comparator 66.

The other inputs to digital comparators 64 and 66 comprises a digital ramp signal. This digital ramp signal is generated by a combination of oscillator 12, counter 14, tapped delay line 16 and encoder 20. This digital ramp signal is a 16 bit signal that counts from the lowest number possible (hexadecimal 0000) to the highest number possible (hexadecimal FFFF) during each of the sampling periods of digital signal source 10. It is considered most advantageous to provide a single oscillator and counter (such as oscillator 12 and counter 14) to provide all 16 bits of this 16 bit ramp signal. However, the counting rate required for such a ramp generator is approximately 2.9 gigahertz. This is believed to exceed the rate of operation of commonly available components for counter 14. Accordingly, a hybrid technique is proposed for embodiment of the present invention.

The proposed hybrid technique is illustrated in FIG. 1. This includes oscillator 12, counter 14, tapped delay line 16 and encoder 20. Oscillator 12 operates at a frequency of approximately 180 megahertz. This is 44.1 kilohertz$\times 2^{12}$. Thus, counter 14 counts through all of the possible states of 12 bits once within each sampling period at the 44.1 kilohertz rate. These 12 bits comprise the twelve most significantly bits supplied to digital comparator 64 and a digital comparator 66. It is believed that circuits formed of emitter coupled logic (ECL) would be fast enough to embody counter 14. In other respects, counter 14 is conventional in design.

Tapped delay line 16 and encoder 20 are employed to generate the four least significant bits of the digital ramp signal. Tapped delay line 16 also receives the output from oscillator 12. Taps delay line 16 includes 16 taps (noted at bundle 18 illustrated in FIG. 1.). These 16 taps are separated in time corresponding to the 2.9 gigahertz rate. Thus, the pulse signal from oscillator 12 when applied to tapped delay line 16 would be output from a succession of the taps at the 2.9 gigahertz counting rate. Encoder 20 receives all 16 taps from tapped delay line 16. Encoder 20 generates a 4 bit output which corresponds to the number of the latest tap which generates an output. Thus, an encoder 20 generates a 4 bit number which counts from hexadecimal 0 to hexadecimal F for each 12 bit output from counter 14. These 4 bits form the least significant bits of 16 bit bus 63. Sixteen bit bus 63 is connected to the negative input of digital comparator 64 and digital comparator 66.

Digital comparator 64 and 66 are essentially identical in character. Each digital comparator compares the magnitude of the two 16 bit numbers applied thereto. Each generates a "one" output when the positive input is greater than the negative input and generates a "zero" output when the negative input is greater than the positive input. Because of the very short time that the two inputs would ever be equal (on the order of 0.3 nanoseconds) it does not matter exactly which state the digital comparators 64 and 66 enter when the two digital inputs are identical. The respective outputs of digital comparators 64 and 66 are pulse width modulated signals having a pulse rate equal to the sampling rate of 44.1 kilohertz and having a pulse duration based upon the particular digital number from the digital signal source. A higher digital number will cause digital comparator 64 to generate a shorter pulse while a lower number will cause digital comparator 64 to generate a longer pulse. Because digital comparator 66 operates on an inverted signal, this sense is reversed for digital comparator 66.

Both digital comparators 64 and 66 are connected to identical output circuits. The output of digital comparator 64 is connected to inverter 160. The output of inverter 160 is connected to light emitting diode 164 through current limiting resistor 162. Light emitting diode 164 thus produces a lighted output dependent upon the digital state of the output of digital comparator 64. Digital comparator 66 likewise drives an output circuit comprising inverter 166, current limiting resistor 168 and light emitting diode 170.

Figure 2:
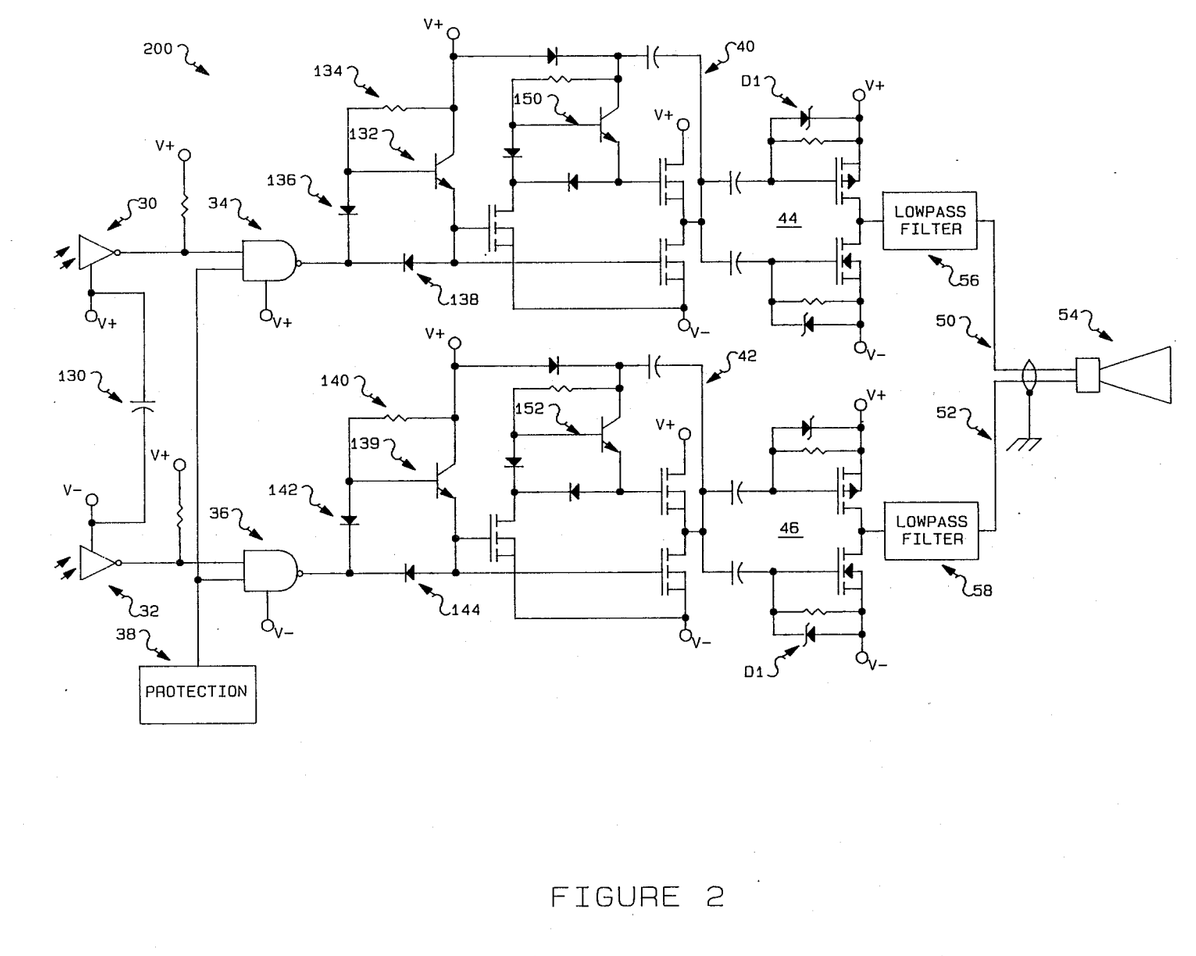
FIG. 2 is a circuit diagram of the power amplifier of the present invention.

Reference is now made to the FIG. 2 drawing showing power amplifier 200. Inverters 30 and 32 are optically sensitive and are coupled to receive light from light emitting diodes 164 and 170, respectively. A capacitor 130 and DC voltage sources are connected to the power supply terminals of inverters 30 and 32 as shown. The outputs of inverters 30 and 32 are then passed to the respective upper input terminals of the NAND gates 34,36. The protection circuit 38 is operably connected to the respective lower input terminals of the aforementioned gates to provide turn-off in the event of an over-current, or other undesired condition being present. The output from the upper NAND gate 34 passes through an amplifying transistor 132 with resistor 134 and diodes 136,138 connected in circuit as illustrated. The second amplifying transistor 139 is connected to the output of the lower gate 36. The transistor 139 further has a resistor 140 and diodes 142 and 144 connected in circuit with it as shown.

Next following in the two branches are V-MOS transistor pairs 40 and 42. Totem-pole driver circuits are provided which include transistor 150 for V-MOS transistor pair 40 and transistor 152 for V-MOS transistor pair 42. Appropriate plus and minus voltage sources are connected to the sources and drains of the aforementioned transistor pairs 40,42 in a manner well-known in the art.

The final output stage includes a pair of V-MOS transistors of the P and N channel type connected in upper complementary transistor pair 44. Appropriate biasing networks and DC sources are coupled in circuit as shown. The output of V-MOS complementary transistor pair 42 is connected via low pass filter 56 to terminal 50 of load 54. The second complementary pair of V-MOS transistors 46 are connected similarly to V-MOS complementary transistor pair 42. The output of second V-MOS complementary pair 46 is connected via low pass filter 58 to terminal 52. The incorporation of the AC coupled complementary pairs permits high voltage gain, high speed, high current output through terminals 50 and 52 of the load which in this case is the speaker 54.

The use of light emitting diodes 164 and 170 together with optically sensitive inverters 30 and 32 provides electrical isolation between the input encoder 100 and the output power amplifier 200. This permits the use of a power supply for power amplifier 200 without a transformer while still providing isolation between the signal input and the AC power supply. The use of a transformerless power supply for power amplifier 200 is considered advantageous for the transient response when driving the load device.

Figure 3:
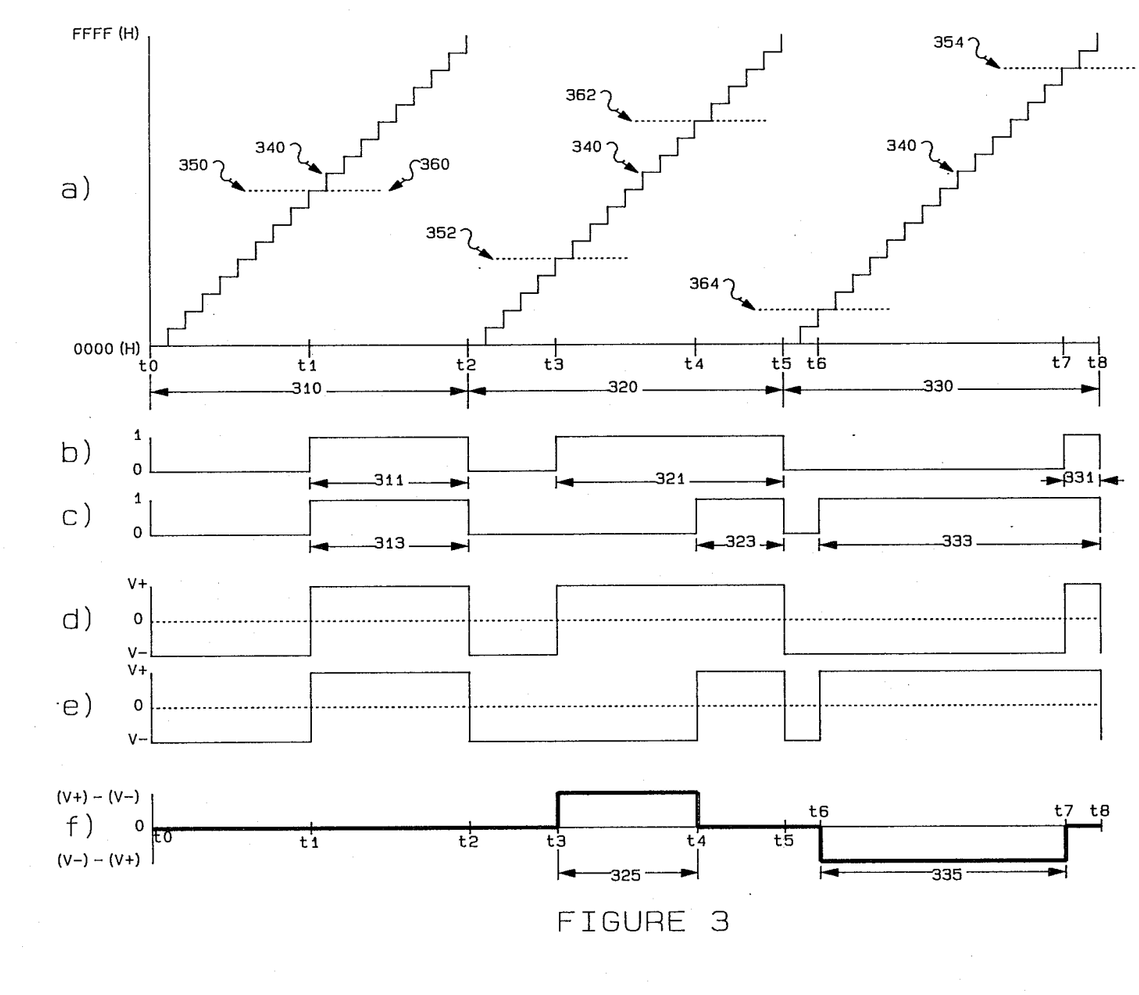
FIG. 3 is an illustration of typical timing diagrams of the embodiment of the invention illustrated in FIGS. 1 and 2.

The operation of the apparatus illustrated in FIGS. 1 and 2 will now be explained in conjunction with the waveform diagrams appearing in FIG. 3. FIG. 3 includes subparts (a)–(f). FIG. 3(a) represents an indication of the digital numbers input to comparators 64 and 66. FIG. 3(b) represents the output waveform of digital comparator 64. FIG. 3(c) represents the output waveform digital comparator 66. FIG. 3(d) represents the voltage applied to terminal 50 of speaker 54. FIG. 3(e) represents the voltage applied to terminal 52 of speaker 54. Lastly, FIG. 3(f) represents the current flowing through speaker 54.

FIG. 3(a) illustrates the waveforms applied to the respective inputs of comparators 64 and 66 for three consecutive sample periods 310, 320 and 330. FIG. 3(a) illustrates schematically the digital ramp signal 340 as counting from hexadecimal 0000 to hexadecimal FFFF once within each of these three sampling periods 310, 320 and 330. Although digital ramp signal 340 is illustrated as a stairstep wave, in reality the nubmer of steps of the digital ramp signal 340 would be much finer than those illustrated, and in the present scale this line would be indistinguishable from a straight line. FIG. 3(a) further illustrates the occurrence of times $t_0$ to $t_8$. These particular times will be employed in the later explanation of the manner in which the digital encoder/amplifier of the present invention operates.

During sample interval 310, the input digital word from digital source 10 has the value 350. The value 350 has been selected to be intermediate between the lowest possible value of hexadecimal 0000 and the highest possible value of the hexadecimal FFFF. Because this is the intermediate value, the inverted value produced by inverter banks 62 is virtually identical. In reality, there is a small difference between hexadecimal 7FFF and hexadecimal 8000, however, in the scale illustrated in FIG. 3(a), this difference is negligible. Thus, the normal and inverted signals during sample interval 310 are both illustrated as level 350.

FIGS. 3(b) and (c) illustrate the outputs of comparators 64 and 66 respectively. During the time interval from $t_0$ to $t_1$ the digital word 350 and the inverted digital word are both greater than the digital ramp signal 340. Therefore, the output is a "0." During the interval between time $t_1$ and time $t_2$ (the end of sample period 310) the digital ramp signal 340 is greater than both the digital word 350 and the inverted digital word 360. Therefore, the outputs are both a "1." Thus during interval 311 light emitting diode 164 is on and during interval 313 light emitting diode 170 is on.

The voltages applied to the terminals 50 and 52 of speaker 54 are illustrated in FIGS. 3(d) and 3(e), respectively. During the time interval from $t_0$ to $t_1$ the voltage V— is applied to terminal 50. Likewise, this voltage V— is applied to terminal 52. During the time interval from $t_1$ to $t_2$ the voltage V+ is applied to terminal 50. Similarly, the voltage V+ is applied to terminal 52 during this same interval. FIG. 3(f) illustrates the net voltage across speaker 54. During the interval from time $t_0$ to $t_1$ the voltage applied to both terminals 50 and 52 is V—. Consequently, no net voltage appears across speaker 54. During the time interval from time $t_1$ to time $t_2$ the voltage applied to terminals 50 and 52 is V+. Likewise, therefore, no net voltage appears across speaker 54 during this time interval. Thus no current flows during any of the sample interval 310.

In actuality, there will some small difference in the switching speed of the transistors used in the output stage and therefore there will be some current through speaker 54 near times $t_0$, $t_1$ and $t_2$. In addition, because digital signal 350 is not identical to inverted digital signal 360, there will be some difference in the voltages applied across terminals 50 and 52 near time $t_1$, thereby causing some small current to flow through speaker 54. However, the combination of these two effects still result in current being supplied to speaker 54 during a negligible portion of sample interval 310.

An explanation will now be made of the wave forms occurring during the second sampling interval 320. During the second sample interval 320 the digital ramp signal 340 counts from hexadecimal 0000 to hexadecimal FFFF in the same manner previously illustrated in regard to sample interval 310. During sample interval 320 the input digital word from digital signal source 10 has a level corresponding to level 352. The inverted digital word output from inverter bank 62 has a level corresponding to level 362.

FIGS. 3(b) and 3(c) illustrate the outputs of the light emitting diodes 164 and 170, respectively. During the interval from time $t_2$ until time $t_3$ the digital ramp signal 340 is less than the input digital word 352. Thus during this interval the output is a digital "0." However, during the interval from time $t_3$ until time $t_5$ (the end of the sample interval 320) the digital ramp signal 340 is greater than the input digital word 352. Accordingly, the output from light emitting diode 164 is on during this interval. In a similar manner it can be seen that digital ramp signal 340 is less than the inverted input signal 362 during the entire interval from time $t_2$ until time $t_4$. Therefore, during this interval the output of light emitting diode 170 is off. During the interval between time $t_4$ and time $t_5$, the digital ramp signal 340 is greater than the inverted digital input signal 362. Accordingly, the output of light emitting diode 170 is on during this time. Note that the length of time that the digital comparator 64 causes light emitting diode 164 to be on, the interval 321, is not the same as the interval 323 in which the digital comparator 66 causes the output of light emitting diode 170 to be on. This difference causes a net voltage across speaker 54 in a manner that will be more fully explained below.

FIG. 3(d) illustrates the signal applied to the terminal 50 of speaker 54. During the interval from time $t_2$ until time $t_3$, the voltage applied to terminal 50 of speaker 54 is V—. During the interval from time $t_3$ until time $t_5$ the voltage applied to terminal 50 is V+. In a similar manner it can be seen that the voltage V— is applied to terminal 52 during the interval between time $t_2$ and time $t_4$ and V+ during the interval between time $t_4$ and the time $t_5$.

FIG. 3(f) illustrates the net voltage across speaker 54. During the sample interval 320 and most particularly during a portion 325 of the sample interval 320 a a net voltage is applied across speaker 54. During the interval from time $t_2$ until time $t_3$, a voltage of V— is applied to both terminals 50 and 52 of speaker 54. Therefore, there is no net voltage during this interval. Likewise, during the time interval from $t_4$ until $t_5$ the voltage applied to terminals 50 and 52 is V+. Thus, there is no net voltage this time interval. However, during the time interval between time $t_3$ and time $t_4$, the voltage supplied to terminal 50 is V+ and the voltage applied to terminal 52 is V—. Thus, a net voltage is applied across the terminals of speaker 54 and a current flows therethrough. The actual current flowing through speaker 54 will be somewhat delayed and filtered via low pass filters 56 and 58.

Lastly, sample interval 330 illustrates another sample applied to encoder 100. As before, digital ramp signal 340 counts from hexadecimal 0000 to hexadecimal FFFF during this sample interval. The input digital word is shown as a signal 354. In this case the inverted signal level from inverter bank 62 is illustrated at line 364. During time interval from time $t_5$ to time $t_7$, the digital ramp signal 340 is less than the input digital signal 354, thereby causing an off output. During the interval from time $t_7$ until time $t_8$ the digital ramp signal 340 is greater than the input digital signal 354. Accordingly, the output during this interval 331 is on. During the time interval between time $t_5$ and time $t_6$, the digital ramp signal 340 is less than the inverted input signal 364. Accordingly, the output of light emitting diode 170 is off during this interval. From the time $t_6$ until time $t_8$ the digital ramp signal 340 is greater than the inverted input signal 364, causing the output of light emitting diode 170 to be on.

FIGS. 3(d) and 3(e) show the voltages applied to terminals 50 and 52, respectively, of speaker 54 during the sample interval 330. From time $t_5$ until time $t_7$ a voltage of V— is applied to terminal 50. From time $t_7$ until time $t_8$ a voltage of V+ is applied to terminal 50. In the same manner, a voltage of V— is applied to terminal 52 during the interval between time $t_5$ and $t_6$. This results in the net voltage across speaker 54 as illustrated in FIG. 3(f). From time until time $t_6$ the voltage applied to both terminals is V—. In the same way, from time $t_7$ until time $t_8$ the voltage applied to both terminals is V+. During the interval between time $t_6$ and time $t_7$, the interval marked 335, a net voltage of (V+)-(V—) is applied across the terminals of speaker 54.

The principle of operation of output amplifier 200 can now be understood with reference to FIG. 3. At any sample time interval in which the input digital word is near or at the quiescant level, approximately one-half of the full scale, no net voltage is ever applied across speaker 54. On the other hand, if the input digital word is above or below this quiescant level then a net voltage is applied across speaker 54. In the case in which the input digit word is less than the quiescant level this voltage has a first polarity, and when the digital word is greater than this quiescant level then the voltage has the opposite polarity. It can be clearly seen that the pulse repetition rate is strictly related to the sampling rate, that is, there is only a single pulse during each sample interval. It can also clearly be seen that the greater the deviation of the input digital signal from the quiescant level the greater the pulse width. Thus for example, during the second sample interval 320 the pulse width is 325 whereas during the third sample interval 330 when the input digital signal is further from the quiescant level the pulse width 335 is greater. Thus, the circuits of the present invention convert the series of input digital words from digital signal source 10 into a set of bipolarity pulse width modulated signals which can be directly applied to a load such as speaker 54.

Although the illustrations of FIG. 3 show an upwardly counting digital ramp signal this is not required. A downwardly counting digital signal would operate equally well. Substitution of a downwardly counting digital ramp signal for the digital ramp signal 340 illustrated in FIG. 3(a) would result in the inversion of the polarity of the output signal applied to load 54 from that illustrated in FIG. 3(f). The exact output signal illustrated in FIG. 3(f) could be realized using a downwardly counting ramp signal by inversion of the signals applied to both light emitting diodes 166 and 170. This could be achieved by provision of an additional inverter after the output of each of the digital comparators 64 and 66b or by reversing the input connections to both digital comparator 64 and digital comparator 66.

Figure 4:
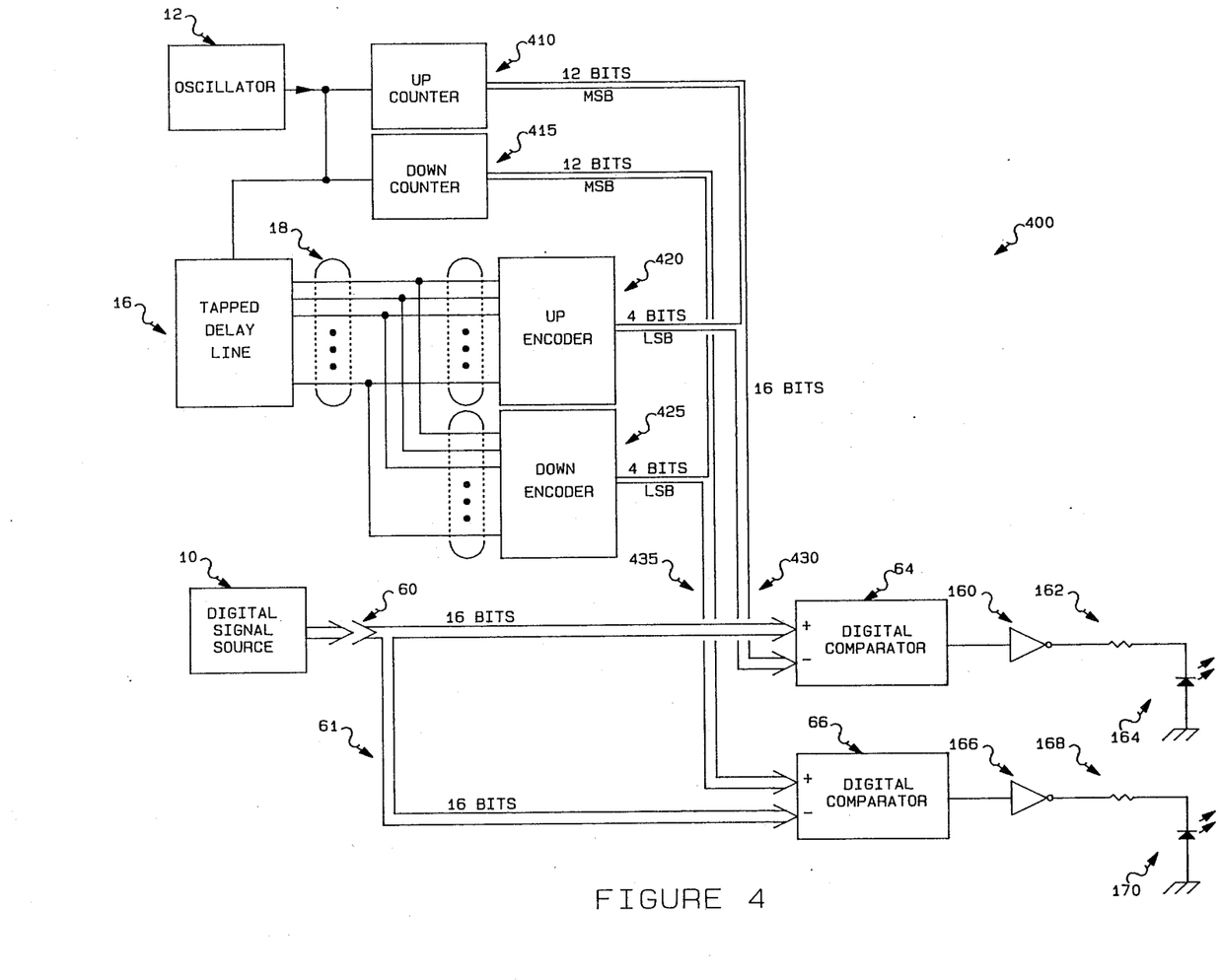
FIG. 4 is an illustration of the digital encoder circuit in accordance with a second embodiment of the present invention.

FIG. 4 illustrates an alternative embodiment of the encoder 100 of the present invention. In the alternative embodiment illustrated in FIG. 2 two digital ramp signals are generated. The first is a digital up ramp signal as illustrated in FIG. 3 and the second is the opposite digital down ramp signal.

FIG. 4 illustrates digital signal source 10 connected to the digital encoder 100 via connector 60 in the same manner as illustrated in FIG. 1. Bus 61 applies the 16 bit words received from digital signal source 10 to the positive input of digital comparator 64 and to the negative input of digital comparator 66. Note that inverter bank 62 is not used in this embodiment.

Digital encoder 100 illustrated in FIG. 4 includes oscillator 12, up counter 410, down counter 415, tapped delay line 16, up encoder 420 and down encoder 425. These components generate the respective digital up ramp signal on bus 430 and the digital down ramp signal on bus 435. Up counter 410 operates in the manner of counter 14 illustrated in FIG. 1. In this case, up counter 410 counts from 0 to the highest number expressible by 12 bits. These twelve bits form the most significant bits of the digital up ramp signal. Up encoder 420 is coupled to the tapped delay line 16 in the manner similar to the connection of encoder 20 to tapped delay line 16 illustrated in FIG. 1. Up encoder 420 generates an output of 4 bits dependent upon the most delayed tap of tapped delay line 16 which generates an output. These four bits form the four least significant bits of the digital up ramp signal of bus 430. Bus 430 applies this digital up ramp signal to the negative input of digital comparator 64 in the same manner as illustrated in FIG. 1. Digital comparator 64 drives inverter 160, current limiting resistor 162 and light emitting diode 164 also in the same manner as illustrated in FIG. 1.

Down counter 415 and down encoder 425 together with oscillator 12 and tapped delay line 16 generate a digital down ramp signal. Down counter 415 operates in a manner similar to up counter 410 except that this counter counts down from the maximum number permissible for 12 bits to zero. Down encoder 416 is coupled to the 16 outputs of tapped delay line 16 in the manner similar to the connection of up encoder 420. down encoder 425 generates a four bit output based upon the tap having the greatest delay of tapped delay line 16 which generates a signal. In this case, down encoder 425 generates the four bits in a down counting fashion. That is down encoder 425 generates the bits "1111" when none of the taps of tap delay line 16 generate an output and decreases this number for each later time tap which generates an output. These four bits form the four least significant bits of the digital down ramp signal appearing on bus 435.

This digital down ramp signal appearing on bus 435 is applied to the positive input of digital comparator 66. Likewise, the input digital word is applied to the negative input of digital comparator 66. Digital comparator 66 drives inverter 166, current limiting resistor 168 and light emitting diode 170 in the manner identical to that previously illustrated in FIG. 1.

Figure 5:
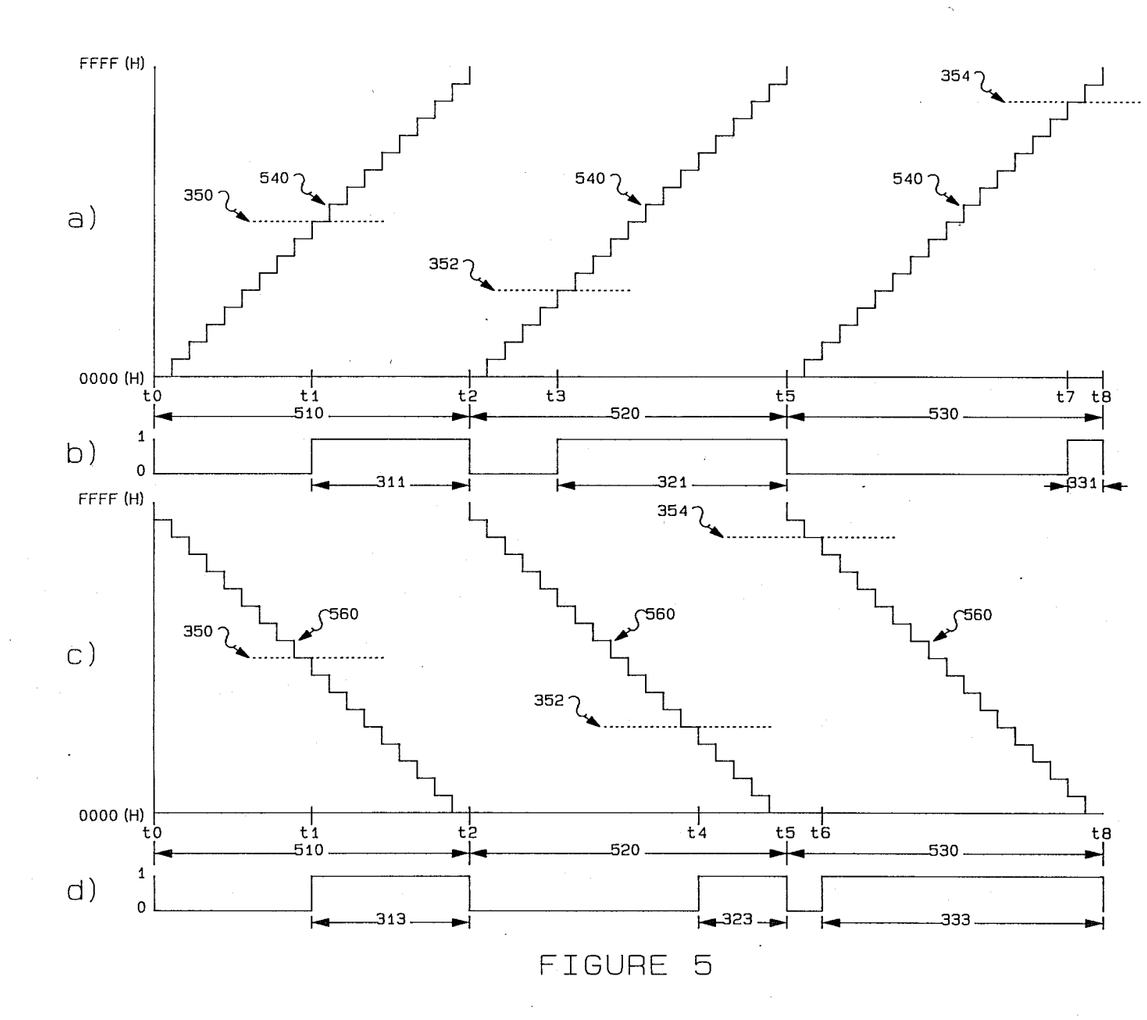
FIG. 5 illustrates timing diagrams in accordance with this second embodiment of the present invention.

FIG. 5 illustrates various wave forms in the embodiment of digital encoder 100 illustrated in FIG. 4. FIG. 5 illustrates sample intervals 510, 520 and 530 which correspond generally to sample intervals 310, 320 and 330 illustrated in FIG. 3. During sample interval 510 the input digital word has a level corresponding to the quiescant level 350. During sample interval 520 the input digital word corresponds to level 352. During the third sample interval 530 the input digital word has a level corresponding to 354. These levels are identical to that previously illustrated in FIG. 3. FIG. 5(a) illustrates the relationship of the up ramp 540 and the digital input signal in the same manner as illustrated in FIG. 3(a). FIG. 5(b) illustrates the output state of light emitting diode 164. Light emitting diode 164 is a pulse width modulated signal having pulse widths of 311, 321 and 331 during the sample intervals 510, 520 and 530, respectively. It should be noted that this signal illustrated in FIG. 5(b) is identical to the signal illustrated in FIG. 3(b), and is generated in the same manner.

FIGS. 5(c) and 5(d) illustrate the function of the digital down ramp signal. FIG. 5(c) illustrates digital down ramp signal 560 which counts from hexadecimal FFFF to hexadecimal 0000 during each of the sample intervals 510, 520 and 530. FIG. 5(c) also illustrates the signal input levels 350, 352 and 354 during the respective sample intervals. FIG. 5(d) illustrates the output of light emitting diode 170. During the interval from time $t_0$ to time $t_1$ the digital down ramp signal 560 is greater than the digital input signal 350, therefore the output of light emitting diode 170 is "0." During the time interval from time $t_1$ to time $t_2$, the digital down ramp signal 560 is less than the input signal 350, therefore, during this interval 313 the output of light emitting diode 170 is on. During the time interval from time $t_2$ to time $t_4$ the digital down ramp signal 560 is greater than the digital input signal 352 of the second sample interval 520. Therefore during this interval the output of light emitting diode 170 is a off. Between time $t_4$ and time $t_5$ the reverse is true and therefore during this interval 323 the output of light emitting diode 170 is a on. In regard to the third sample interval 530, the down ramp digital signal 560 is greater than the input signal level 354 during the time interval from time $t_5$ to time $t_6$, thereby providing a "0" output. During the rest of the time interval, the interval 333 from time $t_6$ to time $t_8$, the digital down ramp signal 560 is less than the input signal level 354 and therefore a "1" output is generated. It can be seen that the wave form of FIG. 5(d) is identical to the wave form of FIG. 3(c). Because of this fact, the output signal applied to speaker 54 illustrated in FIG. 3(f) would also be applied to the speaker 54 is the alternative construction illustrated in FIG. 4 were employed.

Figure 6:
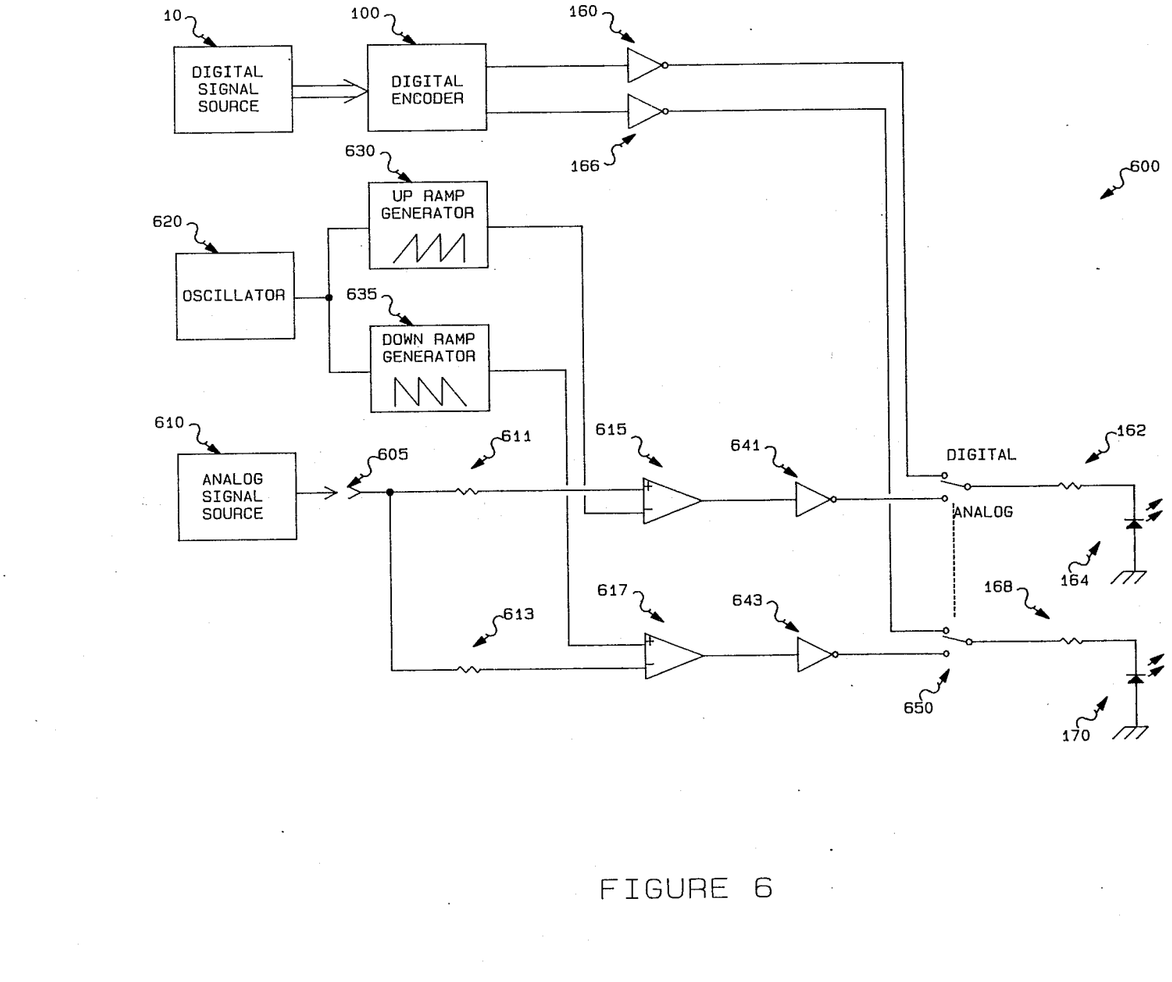
FIG. 6 is an illustration of a combined digital and analog signal source digital encoder in accordance with a further embodiment of the present invention.

FIG. 6 illustrates an embodiment of the present invention employing both digital and analog encoder circuits. FIG. 6 includes digital signal source 10, digital encoder 100 and an analog encoder consisting of oscillator 620, up ramp generator 630, down ramp generator 635, comparators 615 and 617 and inverters 641 and 643. This digital encoder generates a pair of pulse width modulated signals in the same manner previously described in relation to the digital encoder 100.

The analog encoder operates in the manner disclosed in my U.S. Pat. No. 4,404,526 entitled "High Fidelity Audio Encoder/Amplifier" issued Sept. 13, 1983. The circuits illustrated in FIG. 6 are a simplification of the circuits illustrated in FIG. 1 of that prior U.S. patent. The analog signal encoder operates generally in the same manner as the digital signal encoder illustrated in FIG. 4. Oscillator 620 drives an up ramp generator 630 and a down ramp generator 635 which generate respective saw-tooth wave forms having oppositely directed slopes. The analog signal source 610 generates an analog signal which is coupled to the combined digital and analog encoder 600 via connector 605. This analog signal is applied via resistor 611 to the positive input of analog comparator 615 and via resistor 613 to the negative input of analog comparator 617. Analog comparator 615 compares the input analog signal with the up ramp signal from up ramp generator 630. The output is coupled to inverter 641 and which generates a digital signal of the same type as generated by inverters 160 and 166. Similarly, analog comparator 617 compares the down ramp signal from down ramp generator 635 to the input analog signal. Its output is connected to inverter 643 which generates a similar digital output.

FIG. 6 further illustrates a two position two pole switch 650 which switches between the digital signal source 10 and the analog signal source 610. In the first position illustrated in FIG. 6 the output of inverter 160 is coupled to light emitting diode 164 through current limiting resistor 162 in the same manner previously illustrated in FIGS. 1 and 4. Similarly, the output of inverter 166 is coupled to light emitting diode 170 through current limiting resistor 168 in the manner illustrated in FIGS. 1 and 4. When the source switch 650 is switched to the opposite condition (not illustrated in FIG. 6) then the output from inverter 641 is coupled to light emitting diode 164 via current limiting resistor 162 and the output of inverter 643 is coupled to light emitting diode 170 through current limiting resistor 168. In this fashion, switch 650 can switch between the respective digital and analog encoders and their corresponding signal sources. The light outputs of light emitting diodes 164 and 170 are coupled to a power amplifier 200 as illustrated in FIG. 2.

The proposed use for the combined encoders illustrated in FIG. 6 is as follows. It is proposed that a digital signal source such as a compact disc player or a digital tape player be enclosed in the same housing as the digital encoder 100, the analog encoder and the power amplifier 200 illustrated in FIG. 2. In this regard, it is typically not possible in current compact disc players or digital tape recorders to receive the digital data directly, however if these circuits are combined in the same audio component it would not be necessary to provide any analog signals in this system until the output signal is applied to the loud speaker.

Because of the advantages of the analog signal encoder when employed with the digital power amplifier as exemplified in my prior U.S. Pat. No. 4,404,526, it is considered advantageous to employ the digital signal encoder illustrated in FIG. 6 in this same housing. In this manner, the combined digital signal source and digital power amplifier could be employed in the same manner as FM receivers known in the art are currently employed. That is, while having its own signal source and amplifier it is also capable of receiving other program sources for application to the same digital power amplifier. It is also advantageous to allow switching to select a plurality of analog signal sources such as analog signal source 610. By this means the advantages of the pure digital processing of the digital encoder 100 in accordance with this invention and the combined analog encoder/amplifier of may earlier U.S. Pat. No. 4,404,526 may be employed in the same housing.

Although specific embodiments of the present invention have been described, those skilled in the art would understand that various modifications and improvements are possible without departing from the scope of the invention. In particular, it should be noted that the above description has related to only a signal channel. It is well understood by those skilled in the art that a stereo system could be constructed by providing a second channel in the same manner as that described herein.

I claim:

1. A digital audio system comprising:
an input for receiving a digital input signal comprising a predetermined number of bits M representing the sampled amplitude of an audio signal at a predetermined sampling rate;
an inverter bank connected to said input including M inverters, each inverter for inverting a corresponding bit of said digital input signal thereby forming an inverted digital input signal;
a digital ramp generator for generating a digital ramp signal of M bits, said digital ramp signal counting between zero and the highest number representable by said M bits once each period of said predetermined sampling rate;
a first digital comparator connected to said input and said digital ramp generator for generating an output in a first digital state when said digital input signal is less than said digital ramp signal and an output in a second digital state when said digital input signal is greater than said digital ramp signal;
a second digital comparator connected to said inverter bank and said digital ramp generator for generating an output in said first digital state when said inverted digital input signal is less than said digital ramp signal and an output in said second digital state when said inverted digital input signal is greater than said digital ramp signal; and
an output driver connected to said first and second digital comparators and adopted for connection to a load device having first and second terminals, said output driver including
a first power switching device for connecting a first polarity of a DC power source to a first terminal of said load device when said first digital comparator outputs said first digital state and for connecting the opposite polarity of the DC power source to said first terminal of said load device when said first digital comparator outputs said second digital state, and
a second power switching device for connecting the first polarity of said DC power source to a second terminal of said load device when said second digital comparator outputs said first digital state and for connecting said second polarity of the DC power source to said second terminal of said load device when said opposite digital comparator outputs said second digital state.

2. The digital audio system as claimed in claim 1, wherein said digital ramp generator includes:
an oscillator for generating pulses at a frequency which is $2^N$ times said predetermined sampling rate, where N is less than said predetermined number of bits M;
a counter device of N bits connected to said oscillator for counting said pulses of said oscillator;
a tapped delay line connected to said oscillator having $2^{M-N}$ taps which are equally spaced in time by T/M seconds, where T is the length of time at one period at said predetermined sampling rate; and
an encoding means connected to said tapped delay line for encoding signals received from said $2^{M-N}$ taps into a digital signal of M−N bits, whereby said M bit digital ramp count signal comprises said N bits output from said counter device as the most significant bits and said M−N bits output from said encoding means as the least significant bits.

3. The digital audio system as claimed in claim 1, further comprising:
a digital signal source connected to said input for supplying said digital input signal.

4. The digital audio system as claimed in claim 3, wherein:
   said digital signal source consists of a compact disk player for recalling digital information stored on a compact disk.

5. The digital audio system as claimed in claim 4, wherein:
   said digital signal source consists of a digital tape recorder for recalling digital information stored on a digital tape.

6. The digital audio system as claimed in claim 1, further comprising:
   a first optoelectronic isolator connected for optically coupling and electrically isolating said first digital comparator and said first switching device; and
   a second optoelectronic isolator connected for optically coupling and electrically isolating said second digital comparator and said second switching device;
   whereby said input, said inverter bank, said digital ramp generator and said first and second digital comparators are electrically isolated from said output driver and the load.

7. The digital audio system as claimed in claim 1, wherein:
   said digital ramp generator generates said digital ramp signal counting upwardly from zero to the highest number representable by said M bits.

8. The digital audio system as claimed in claim 1, wherein:
   said digital ramp generator generates said digital ramp signal counting downwardly from the highest number representable by said M bits to zero.

9. A digital audio system comprising:
   an input for receiving a digital input signal comprising a predetermined number M bits representing the sampled amplitude of an audio signal at a predetermined sampling rate;
   a digital up ramp generator for generating a digital up ramp signal of M bits, said digital up ramp signal counting up from zero to the highest number representable by said M bits once each period of said predetermined sampling rate;
   a digital down ramp generator for generating a digital down ramp signal of M bits, said digital down ramp signal counting down from the highest number representable by said M bits to zero once each period of said predetermined sampling rate;
   a first digital comparator connected to said input and said digital up ramp generator for generating an output in a first digital state when said digital input signal is less than said digital up ramp signal and an output in a second digital state when said digital input signal is greater than said digital up ramp signal;
   a second digital comparator connected to said input and said digital down ramp generator for generating an output in said first digital state when said digital input signal is greater than said digital down ramp signal and an output in said second digital state when said input digital signal is less than said digital down ramp signal;
   an output driver connected to said first and second digital comparators and adopted for connection to a load device having first and second terminals, said output driver including
   a first power switching device for connecting a first polarity of a DC power source to said first terminal of said load device when said first digital comparator outputs said first digital state and for connecting the opposite polarity of the DC power source to said first terminal of said load device when said first digital comparator outputs said second digital state, and
   a second power switching device for connecting the first polarity of the DC power source to said second terminal of said load device when said second digital comparator outputs said first digital state and for connecting the second polarity of the DC power source to said second terminal of said load device when said second digital comparator outputs said second digital state.

10. The digital audio system as claimed in claim 9, further comprising:
    an oscillator for generating pulses at a frequency which is $2^N$ times said predetermined sampling rate, where N is less than said predetermined number of bits M;
    a tapped delay line connected to said oscillator having $2^{M-N}$ taps which are equally spaced in time by T/M seconds, where T is the length of time of one period at said predetermined sampling rate;
    said digital up ramp generator includes
       an up counter device of N bits connected to said oscillator for upwardly counting said pulses of said oscillator from zero to the highest number representable by said N bits, and
       an up encoding means connected to said tapped delay line for encoding signals received from said $2^{M-N}$ taps into a digital signal of M−N bits, said digital signal of M−N bits counting upwardly from zero to the highest number representable by said M−N bits corresponding to the latest tap generating an output, whereby said M bit digital up ramp signal comprises said N bits output from said up counter device as the most significant bits and said M−N bits output from said up encoding means as the least significant bits; and
    said digital down ramp generator includes
       a down counter device of N bits connected to said oscillator for downwardly counting said pulses from said oscillator from the highest number representable by said N bits to zero, and
       a down encoder means connected to said tapped delay line for encoding signals received from said $2^{M-N}$ taps into a digital signal of M−N bits, said digital signal of M−N bits counting downwardly from the highest number representable by said M−N bits to zero corresponding to the latest tap generating an output, whereby said M bit digital down ramp signal comprises said N bits output from said down encoder means as the least significant bits.

11. The digital audio system as claimed in claim 9, further comprising:
    a digital signal source connected to said input for supplying said digital input signal.

12. The digital audio system as claimed in claim 11, wherein:
    said digital signal source consists of a compact disk player for recalling digital information stored on a compact disk.

13. The digital audio system as claimed in claim 12, wherein:

said digital signal source consists of a digital tape recorder for recalling digital information stored on a digital tape.

14. The digital audio system as claimed in claim 9, further comprising: a first optoelectronic isolator connected for optically coupling and electrically isolating said first digital comparator and said first switching device; and
   a second optoelectronic isolator connected for optically coupling and electrically isolating said second digital comparator and said second switching device;
whereby said input, said inverter bank, said digital ramp generator and said first and second digital comparators are electrically isolated from said output driver and the load.

15. An audio system comprising:
a digital signal source for generating a digital input signal comprising a predetermined number of bits M representing the sampled amplitude of an audio signal at a predetermined sampling rate;
an inverter bank connected to said digital signal source including M inverters, each inverter for inverting a corrresponding bit of said digital input signal thereby forming an invented digital input signal;
a digital ramp generator for generating a digital ramp signal of M bits, said digital ramp signal counting between zero and the highest number representable by said M bits once each period of said predetermined sampling rate;
a first digital comparator connected to said digital signal source and said digital ramp generator for generating an output in a first digital state when said digital input signal is less than said digital ramp signal and an output in a second digital state when said digital input signal is greater than said digital ramp signal;
a second digital comparator connected to said inverter bank and said digital ramp generator for generating an output in said first digital state when said inverted digital input signal is less than said digital ramp signal and an output in said second digital state when said inverted digital input signal is greater than said digital ramp signal;
an analog input for receiving an analog input signal having a predetermined signal range;
an analog up ramp generator for generating an analog up ramp signal having a value sweeping upwardly through said predetermined range once each period of said predetermined sampling rate;
an analog down ramp generator for generating an analog down ramp signal having a value sweeping downwardly through said predetermined range once each period of said predetermined sampling rate;
a first analog comparator connected to said analog input and said analog up ramp generator for generating an output in said first digital state when said analog input is less than said analog up ramp signal and an output in said second digital state when said analog input is greater than said analog up ramp signal;
a second analog comparator connected to said analog input and said analog down ramp generator for generating an output in said first digital state when said analog input signal is greater than said analog down ramp signal and an output in said second digital state when said analog signal is less than said analog down ramp signal;
a switching device connected to said first and second digital comparators and said first and second analog comparators having first and second outputs for selectively connecting either the outputs of said first and second digital comparators to said first and second outputs, respectively, or the outputs of said first and second analog comparators to said first and second outputs, respectively; and
an output driver connected to said switching device and adapted for connection to a load service having first and second terminals, said output driver including
   a first power switching device for connecting a first polarity of a DC power source to said first terminal of said load device when said first output of said switching device outputs said first digital state and for connecting the opposite polarity of said DC power source to said first terminal of said load device when said first output of said switching device outputs said second digital state, and
   a second power switching device for connecting said first polarity of said DC power source to said second terminal of said load device when said second output of said switching device outputs said first digital state and for connecting said opposite polarity of said DC power source to said second terminal of said load device when said second output of said switching device outputs said second digital state.

* * * * *